United States Patent [19]
Bayraktaroglu

[11] Patent Number: 6,034,383
[45] Date of Patent: Mar. 7, 2000

[54] HIGH POWER DENSITY MICROWAVE HBT WITH UNIFORM SIGNAL DISTRIBUTION

[75] Inventor: Burhan Bayraktaroglu, Millersville, Md.

[73] Assignee: Northrop Grumman Corporation, Los Angeles, Calif.

[21] Appl. No.: 08/969,269

[22] Filed: Nov. 13, 1997

[51] Int. Cl.[7] .............................................. H01L 31/0328
[52] U.S. Cl. .......................... 257/197; 257/205; 257/565
[58] Field of Search ................................. 257/197, 205, 257/565

[56] References Cited

U.S. PATENT DOCUMENTS

| 4,939,562 | 7/1990 | Alderstein | 357/34 |
| 5,616,950 | 4/1997 | Liu | 257/469 |

FOREIGN PATENT DOCUMENTS

405877A2  1/1991  European Pat. Off. .

OTHER PUBLICATIONS

Patent Abstracts of Japan, vol. 96, No. 9, Sep. 30, 1996; JP 08 130222 A (NEC Corp.), May 21, 1996.
"HBTs For Microwave Power Applications", *International Journal of High Speed Electronics and Systems*, vol. 5, No. 3 (1994), Burhan Bayraktaroglu and J. Aiden Higgins, pp. 275–348, Dec. 1994.

*Primary Examiner*—Mark V. Prenty

[57] ABSTRACT

A heterojunction bipolar transistor power cell consisting of a plurality of parallel connected sub-cells arranged in a chevron type of configuration wherein the sub-cells are staggered relative to one another so that the base feed for an input signal can have an equal electrical distance to all of the base contacts while keeping the orientation of the respective emitter fingers of the sub-cells in the same direction. By offsetting the sub-cells in a first or vertical direction, the number of sub-cells that can be arranged in a second or horizontal direction can be increased for the same horizontal distance as a conventional "in-line" design while overcoming the signal distribution limitation of a "fish-bone" design.

16 Claims, 7 Drawing Sheets

HIGH POWER DENSITY MICROWAVE HBT WITH UNIFORM SIGNAL DISTRIBUTION

FIELD OF THE INVENTION

This invention relates generally to heterojunction bipolar transistor (HBT) devices and more particularly to an HBT power cell which provides reduced thermal coupling and uniform signal distribution between sub-cells of the cell for increasing power density.

DESCRIPTION OF RELATED ART

Heterojunction bipolar transistors (HBT) are generally well known and comprise a generic device which finds a broad range of applications in digital, analog and microwave circuitry. In microwave circuits, HBTs can be used for power, low noise and linear amplification as well as for power generation in oscillators. The most significant impact of the HBT in microwave circuits has been in power amplification.

The application range covers the entire microwave frequency spectrum with inroads currently being made into the mm-wave frequencies. Transmitters based on solid-state devices have become an indispensable part of modern microwave systems. The relatively high reliability of these devices coupled with the advantageous size and weight properties offer an attractive alternative to vacuum tubes. However, the output power of solid-state devices are orders of magnitude smaller than those available with vacuum tubes. System concepts such as phased-array antennas are used to combine the output powers of many smaller transmitters to overcome this problem. Such systems are furthermore now successfully being implemented using gallium arsenide (GaAs) based components. Nevertheless, overall system performance continues to depend on the output power of the transmitter in each module that makes up the array. The transmitter performance can be improved by increasing the power density, i.e. higher output power for a given size or by increasing the efficiency of its amplifiers, or both.

Figure 1A:
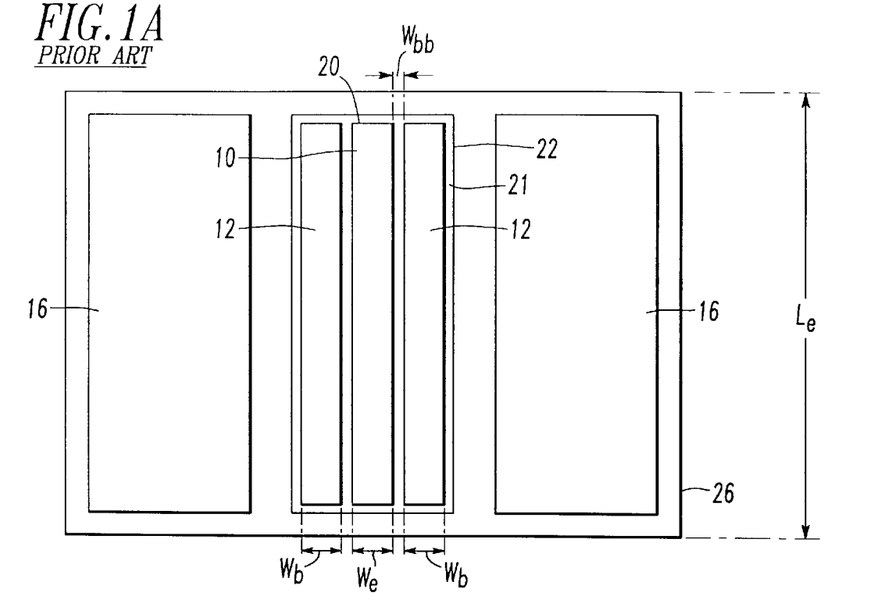
FIGS. 1A and 1B are top plan views and front elevational views, respectively, of a conventional heterojunction bipolar transistor (HBT) having an emitter and base finger configuration.
Figure 1B:
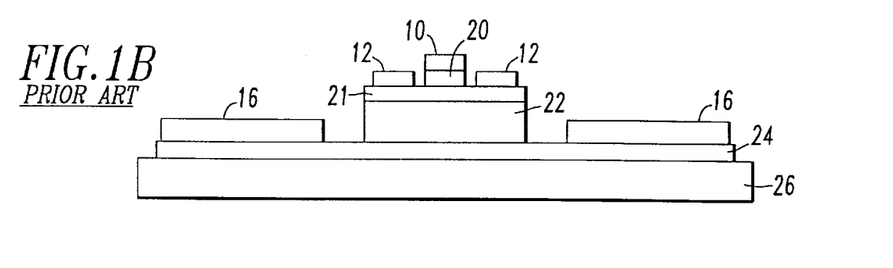

In many respects, an HBT fabricated in GaAs resembles the silicon bipolar junction transistor (BJT). Both are minority carrier, vertically oriented devices. A typical HBT device is shown in FIGS. 1A and 1B. There, a power HBT cell is depicted comprised of a generally elongated rectangular emitter electrode 10 having a width $W_e$ and on each side of which is located a like pair of elongated rectangular base electrodes 12 having a width of $W_b$ and being separated from the emitter 10 by a distance of $W_{bb}$. On either side of the two base electrodes 12 is a pair of collector electrodes 16, consisting of relatively larger rectangular areas, as shown.

FIG. 1B illustrates the epitaxial nature of the device and shows, for example, the emitter electrode 10 being located on top of a first layer 20 which contains selectively doped AlGaAs and beneath which is located a layer 21 of P-type doped GaAs which additionally supports the base electrodes 12. Layer 22 comprises a collector which sits on top of a sub-collector layer 24 of GaAs which also supports the collector electrodes 16. The entire structure is formed on a substrate 26 of undoped GaAs.

Figure 2:
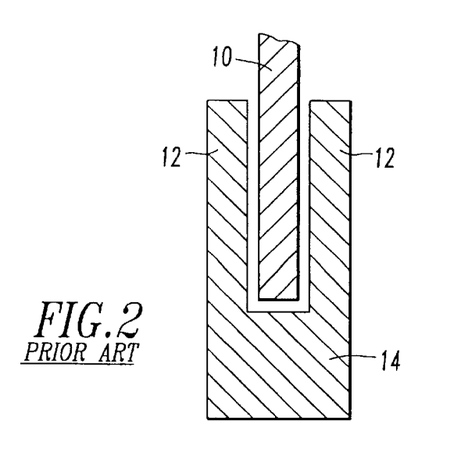
FIG. 2 is a plan view of a well known bifurcated base finger arrangement for a heterojunction bipolar transistor.

The emitter and base electrodes 10 and 12 comprise contact members which are referred to as "fingers". The base fingers 12 typically form part of a bifurcated electrode structure including a common contact segment 14 as shown in FIG. 2. In such a device, with the layers being stacked on top of each other, the current flow is predominantly perpendicular to the surface. For a more detailed description of this type of device, one can refer, for example, to "HBTs For Microwave Power Applications", B. Bayraktaroglu et al., *International Journal of High Speed Electronics and Systems*, Vol. 5, No. 3 (1994), pp. 275–348, World Scientific Publishing Company.

The primary objective of electrical designs in this type of vertical device is to maximize the available power gain for a given active area; however, power gain is a function of temperature and becomes diminished in response to an increase in temperature which increases under large current and voltage bias conditions. The temperature rise due to self-heating is also very significant in devices fabricated on GaAs substrates, since the thermal conductivity of GaAs is relatively poor.

Since the maximum junction temperature is directly related to the device reliability, HBT designs with low thermal resistance are preferred. It is therefore necessary in conventional HBT cell designs to divide the active area of the device into a plurality of small sections or sub-cells and spread them over a relatively large surface area of a semiconductor chip. While there are several ways of accomplishing this, all of them result in relatively low power density cells.

There are normally two problems associated with low power density cells when used for microwave power amplification. First, the width of the semiconductor structure on which the HBT resides determines the output power potential of the amplifier. The number of low power density cells that can be placed across the face of the chip is relatively low and therefore the total output power that can be obtained using low power density cells is less than is desirable. Secondly, because the active areas of an HBT cell comprised of a plurality of parallel sub-cells must be spread over a relatively large surface in the cell, the microwave signal distribution within a conventional HBT cell tends to be non-uniform. For example, if the phase of the signal at each base finger of a HBT sub-cell is not the same, the microwave power gain degrades as the frequency is increased due to a phase difference in signal at each base element.

Figure 3:
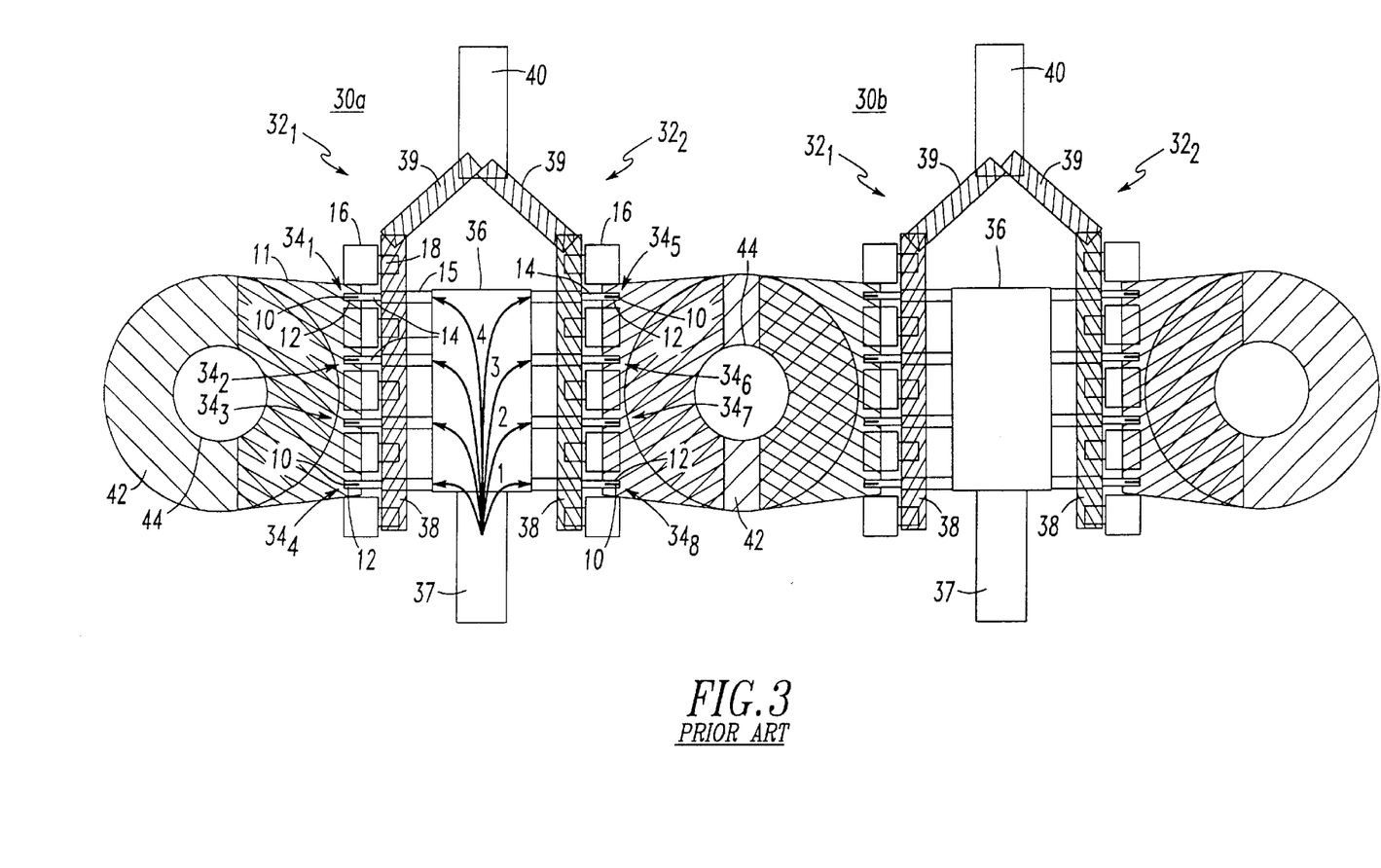
FIG. 3 is a layout of a known prior art HBT cell having a "fish bone" configuration of sub-cells.

One such known prior art cell is shown in FIG. 3. There a pair of HBT cells $30_a$ and $30_b$ are shown each comprised of eight(8) HBT sub-cells, $34_1, 34_2 \ldots 34_8$ arranged in two vertical columns $32_1$ and $32_2$. This is referred to in the art as a "fish-bone" configuration. A horizontal row or "in line" configuration of four(4) such sub-cells $34_1 \ldots 34_4$ is further shown enlarged in FIGS. 4 and 5. In each instance, the common contact segment 14 of the base fingers 12 terminate in enlongated conductor elements 15 which are commonly connected to an input signal by means of a signal distribution network consisting of a relatively wide generally rectangular middle section of transmission line 36 to which is connected an outwardly extending strip of transmission line 37 which acts as a base terminal.

In FIG. 3, collector electrodes 16 of adjacent sub-cells $34_1 \ldots 34_4$ now include an outwardly extending segment of metallization 18 which is connected in parallel by two relatively narrow strips of metallization 38 that span the collector segments 18. The two strips of metallization 38 connect to an outwardly extending strip of metallization 40 which acts as a collector terminal by means of two short strips of metallization 39.

All emitter fingers 10 now connect to a common area of metallization 11, which extends outwardly to respective annular areas of metallization 42 associated with a respective grounding via hole 44 hereinafter referred to simply as a "via" and which are centrally located midway between and on either side of the sub-cell rows $32_1$ and $32_2$. The overlapping portions of metallizations 11 and 42 associated with the inner via 44 act as thermal shunts for the cells $30_a$ and $30_b$. Conventional air bridges, not shown, are also provided, where necessary, to implement crossovers of the various metallizations.

It can be seen with respect to the "fish-bone" arrangement of FIG. 3 that when a base feed input signal is coupled to the base terminal metallization 37, the phase of the base feed signal in branches 1, 2, 3 and 4 to the base fingers 12 is not the same due to the unequal distances to the base conductor elements 15. This causes a frequency dispersion of the input signal.

It should be noted that the spacing between the columns $32_1$ and $32_2$ of sub-cells is determined by the design of the distribution network. In general, as the number of sub-cells 34 in a column, for example column $32_1$, increases, the distance between the columns must also increase to avoid frequency dispersion of the input signal. Because of this problem, the power density in the horizontal direction in FIG. 3 and which is a function of the width of the MMIC chip on which the HBT cells $30_a$ and $30_b$ are fabricated, cannot be increased beyond a certain limit simply by increasing the number of sub-cells in a column. Moreover, if the sub-cells $34_1 \ldots 34_4$ are placed closer to one another in a column, the mutual heating between the sub-cells tend to increase the temperature of the cells $34_2$, $34_3$ and $34_6$, $34_7$ in the middle. When all sub-cells are placed in a column, the hottest part of each sub-cell is aligned with each other, and accordingly the mutual heating is maximized. For an eight (8) sub-cell two column configuration as shown in FIG. 3, the cell-to-cell distance between the cells $30_a$ and $30_b$ is typically 300μm or more.

Figure 5:
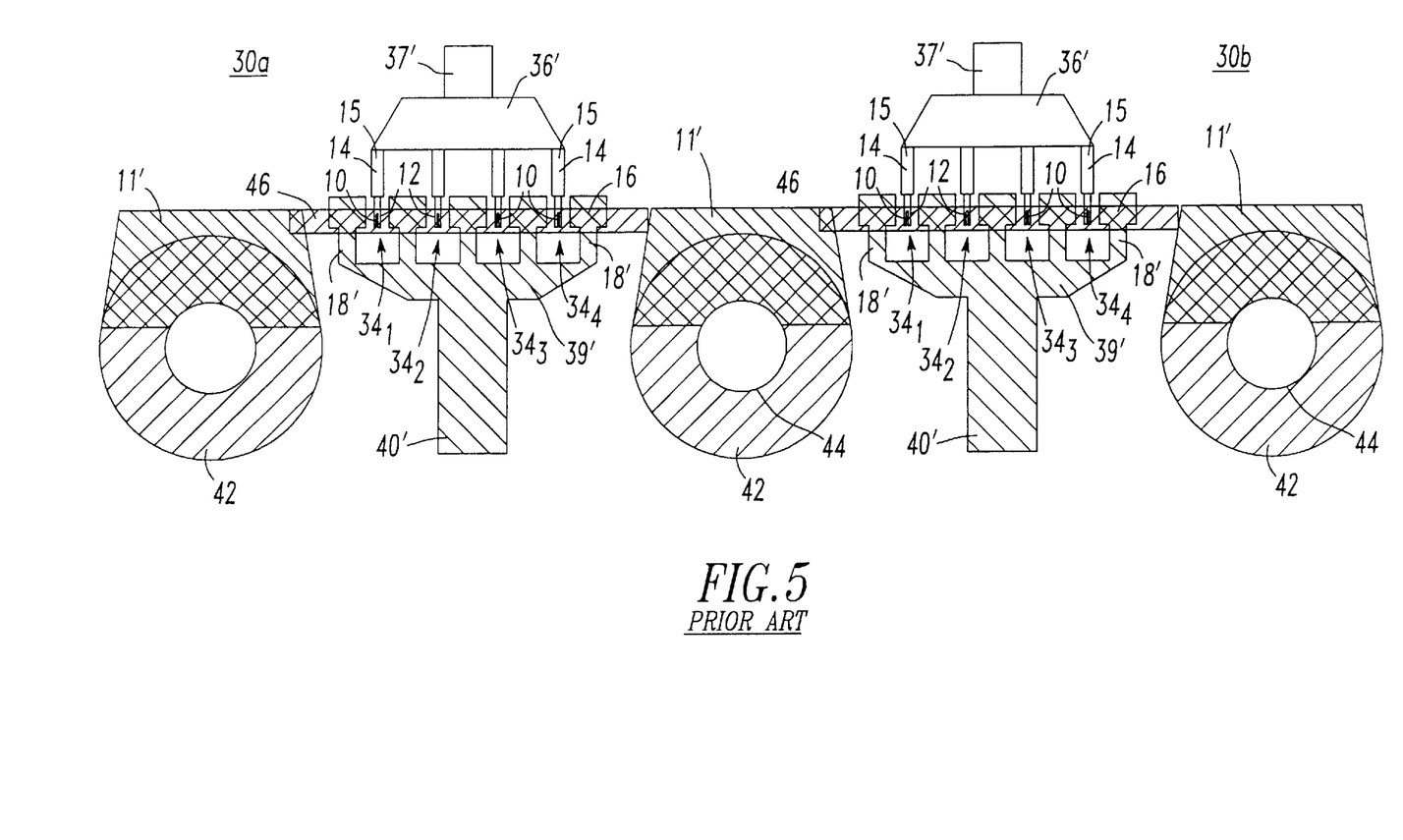
FIG. 5 is illustrative of a known HBT cell having an "in-line" sub-cell configuration.

As known, the problem of frequency dispersion of the input or base feed signal in a "fish-bone" configuration can be solved by an "in-line" cell layout as shown in FIG. 5, where the sub-cells are now placed along a horizontal line or row. In FIG. 5, two HBT cells $30'_a$ and $30'_b$ are shown, each comprised of four sub-cells $34_1 \ldots 34_4$. However, the base input signal is now equally applied to each base conductor element 15 by the base input metallization elements 36' and connected to the base terminals 37'. The collectors 16 now have respective collector segments 18' connected to collector terminal strips 40' by way of metallization 39'. The emitter fingers 10 are now connected to the vias 44 by means of relatively narrow horizontal strips of metallization 46 which are connected between the areas of metallization 11' connected to the annular metallization portions 42.

While the horizontal cell-to-cell distance of HBT cells $30'_a$ and $30'_b$ are again in the order of 300 μm, the output power of each cell $30'_a$ and $30'_b$ is only half that of the cells $30_a$ and $30_b$ shown in FIG. 3. Therefore, the power density in the horizontal direction is reduced in half. Thus the problem associated with power density and frequency dispersion of the microwave input signal impose opposite requirements on HBT cell design. Conventional designs that attempt to balance these two requirements have resulted in low density cells, which in turn, inherently limits the maximum power available from a given size of MMIC chip.

SUMMARY

Accordingly, it is an object of the present invention to provide an improvement in heterojunction bipolar transistors (HBTs).

It is another object of the invention to improve the output power density of heterojunction bipolar power transistors comprised of a plurality of sub-cells.

It is a further object of the invention to provide a high density microwave heterojunction bipolar transistor which also overcomes the problem of unequal signal distribution to a multi sub-cell HBT device without increasing its thermal resistance.

The foregoing and other objects are achieved by a heterojunction bipolar transistor power cell comprised of a plurality of parallel connected sub-cells arranged in a chevron type of configuration wherein the sub-cells are staggered relative to one another so that the base feed for an input signal can have an equal electrical distance to all of the base contacts while keeping the orientation of the respective emitter fingers of the sub-cells in the same direction. By offsetting the sub-cells in a first or vertical direction, the number of sub-cells that can be arranged in a second or horizontal direction can be increased for the same horizontal as a conventional "in-line" design while overcoming the signal distribution limitation of a "fish-bone" design. Since the horizontal distance is critical to determining the overall power capability of a microwave HBT amplifier, an increase in power density of the cell is substantially increased. This inventive concept is particularly applicable to, but limited to, common emitter, common base and cascode HBT configurations.

Further scope of applicability of the present invention will become apparent from the detailed description provided hereinafter. It should be understood, however, that the detailed description and specific examples, while being illustrative of the preferred embodiments of the invention, are provided by way of illustration only, since various changes and modifications coming within the spirit and scope of the invention will become apparent to those skilled in the art from the detailed description.

BRIEF DESCRIPTION OF THE DRAWINGS

The present invention will become more fully understood when considered together with the accompanying drawings which are provided for purposes of illustration only and thus are not meant to be considered in a limiting sense, and wherein.

DETAILED DESCRIPTION OF THE INVENTION

Having described above what is at present considered to be known prior art heterojunction bipolar transistor (HBT)

cell configurations and the limitations associated therewith, reference will now be made to a new and improved HBT cell design which increases power density within a prescribed cell area while at the same time maintaining or reducing thermal coupling between sub-cells by offsetting the placement of the adjacent sub-cells in a vertical direction so as to provide a configuration including two mutually diverging sets of HBT sub-cells.

Figure 6:
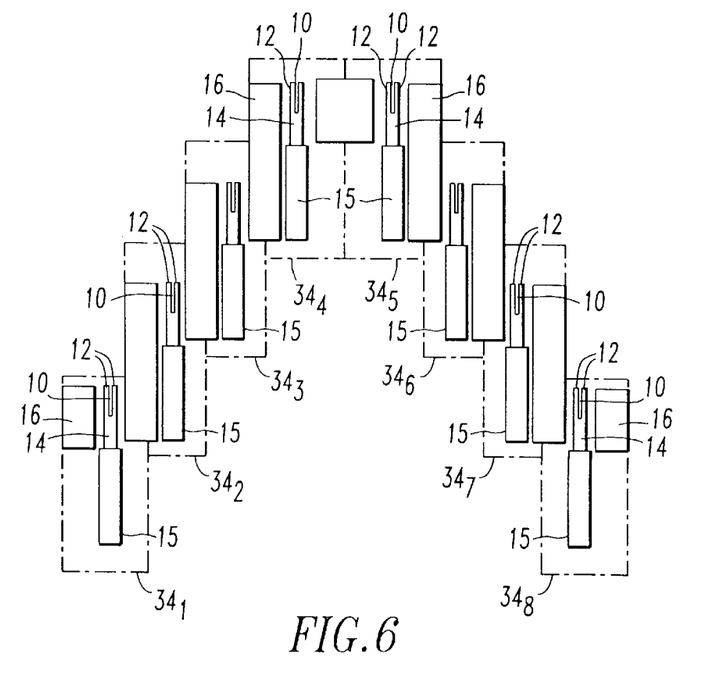
FIG. 6 depicts a sub-cell layout which is generally illustrative of the inventive concept of the subject invention.

Referring now to FIG. 6, shown thereat in its simplest form is an HBT cell 50 comprised of eight HBT sub-cells $34_1$, $34_2$, . . . $34_8$ which are arranged in a chevron type of configuration including two sets of sub-cells $34_1$ . . . $34_4$ and $34_5$ . . . $34_8$. The sub-cells in each set are staggered relative to one another in a vertical direction, while maintaining the horizontal distance across the cell 50 which is equal to, and in this case less, than that required for a four sub-cell "in-line" layout shown in FIG. 4.

As shown in FIG. 6, all of the collector electrodes include elongated contact segments 16 having a constant width. However, their respective lengths vary in order to provide common collector metallization regions coextensive with the emitter 10 and the base elements 12 and 14 of adjacent sub-cells. As can be seen, the outermost collector contact segments 16 are less than half of the length of the intermediate segments 16 with the top or foremost middle segment 16 having a length equalling the outermost collector segments 16 but twice their width.

Figure 4:
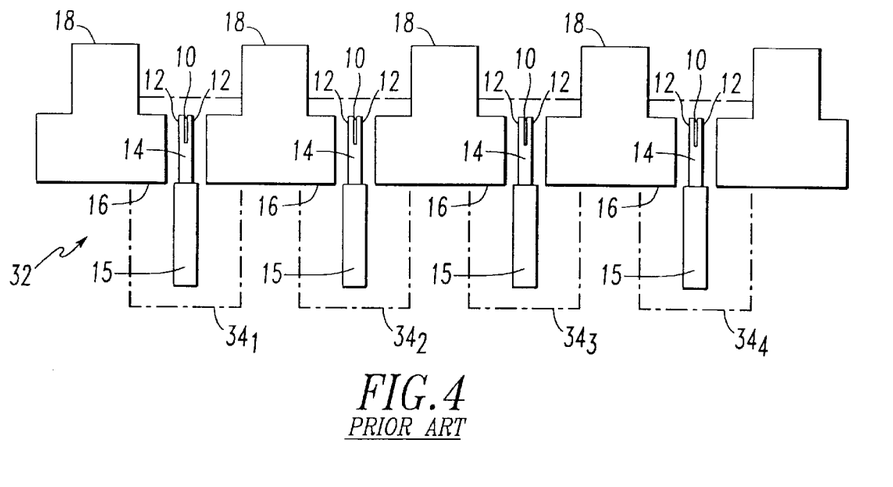
FIG. 4 is illustrative of a HBT cell layout having an "in-line" sub-cell configuration in accordance with the known prior art.

What is significant about this arrangement is that the thermal coupling distance between adjacent sub-cells, for example sub-cells $34_1$ and $34_2$ of FIG. 6 is the same as the thermal coupling distance of sub-cells $34_1$ and $34_2$ of FIG. 4. In both instances, the orientation of the emitter fingers 10 remain the same. However, the number of sub-cells $34_1$ . . . $34_8$ in FIG. 6 is doubled the number of sub-cells $34_1$ . . . $34_4$ that could be placed the same horizontal distance of an in-line configuration of FIG. 4.

Figure 7:
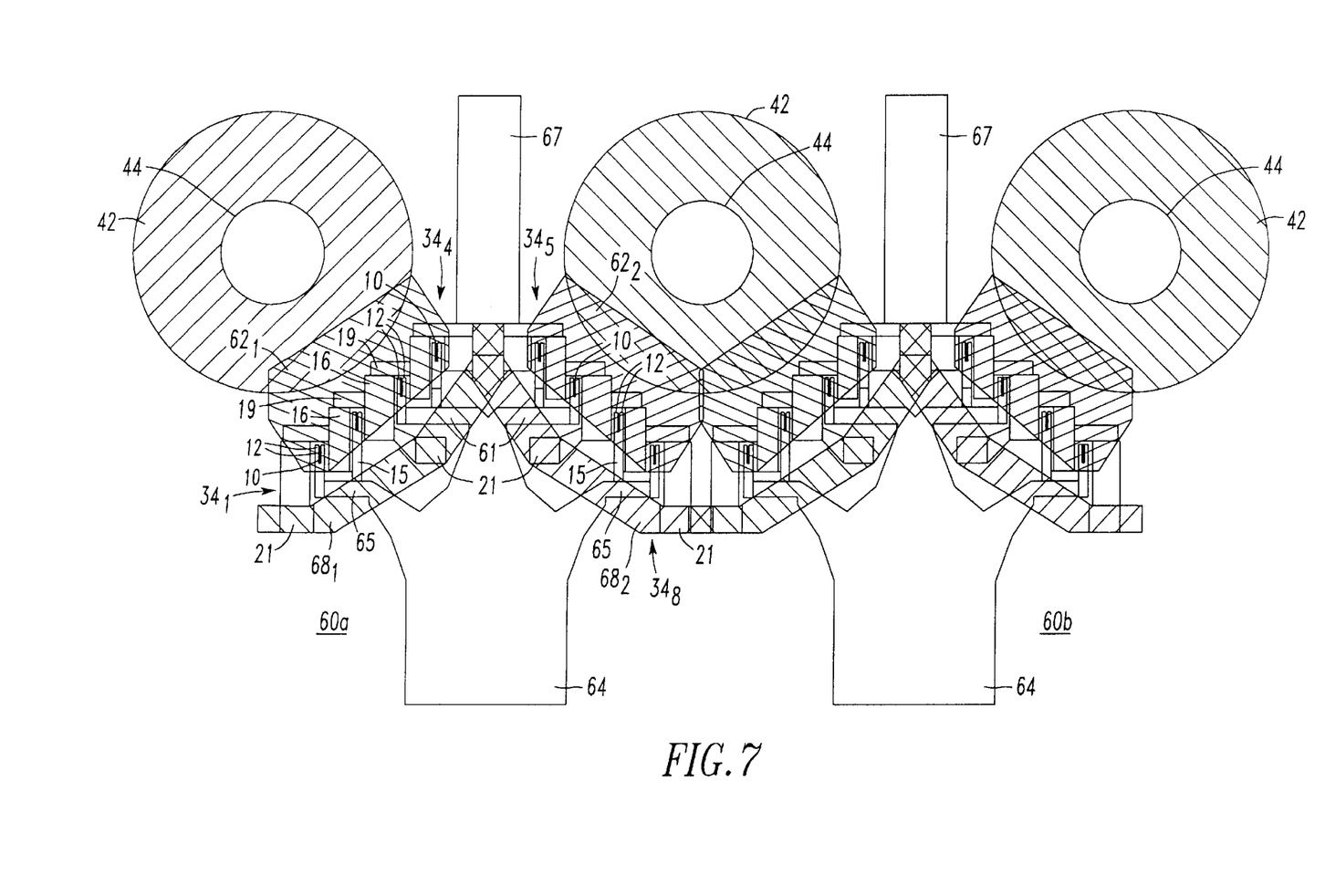
FIG. 7 is a layout illustrative of a common emitter HBT circuit configuration in accordance with one preferred embodiment of the subject invention.
Figure 8:
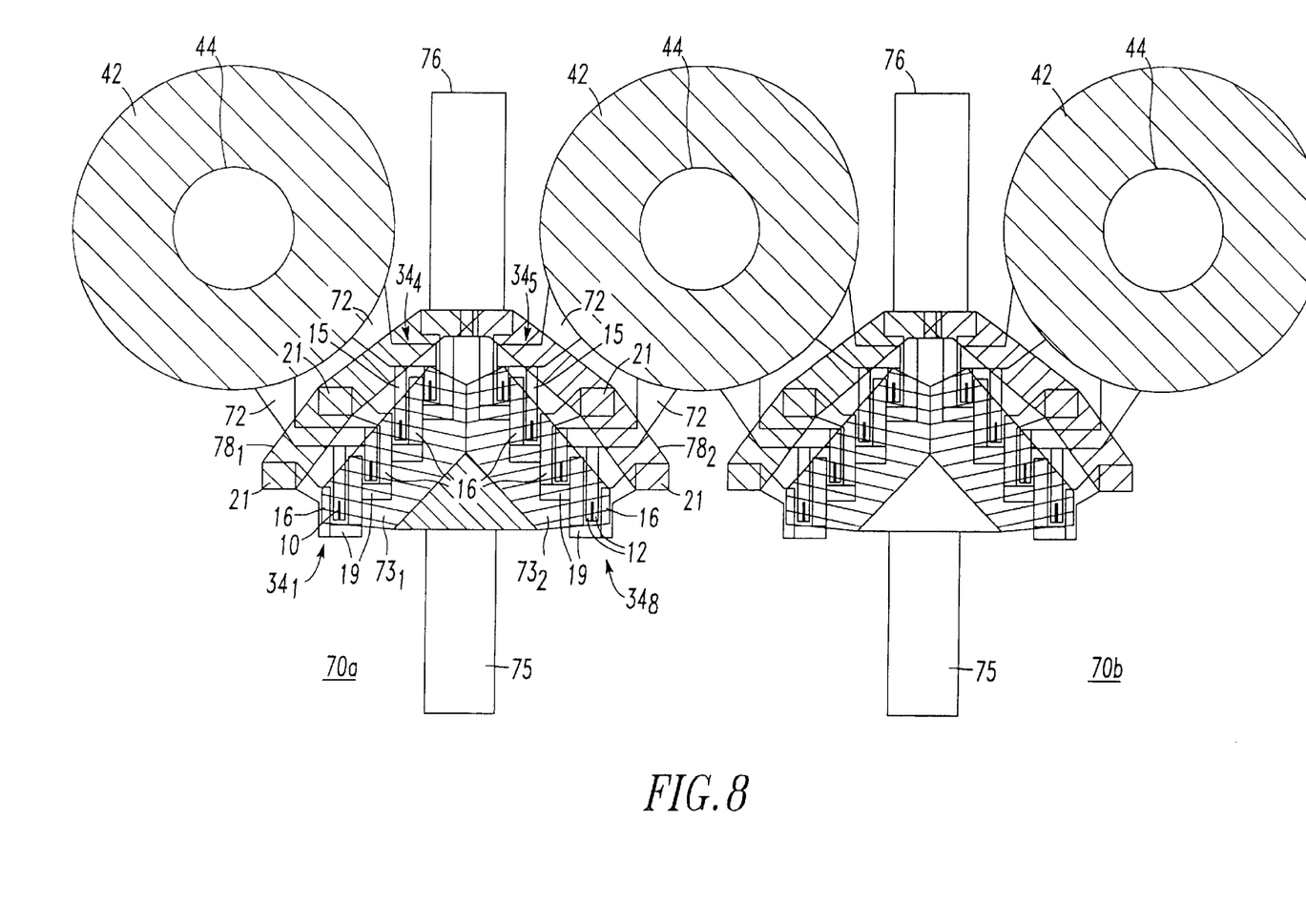
FIG. 8 is a layout of a common base HBT circuit configuration in accordance with another preferred embodiment of the subject invention.
Figure 9:
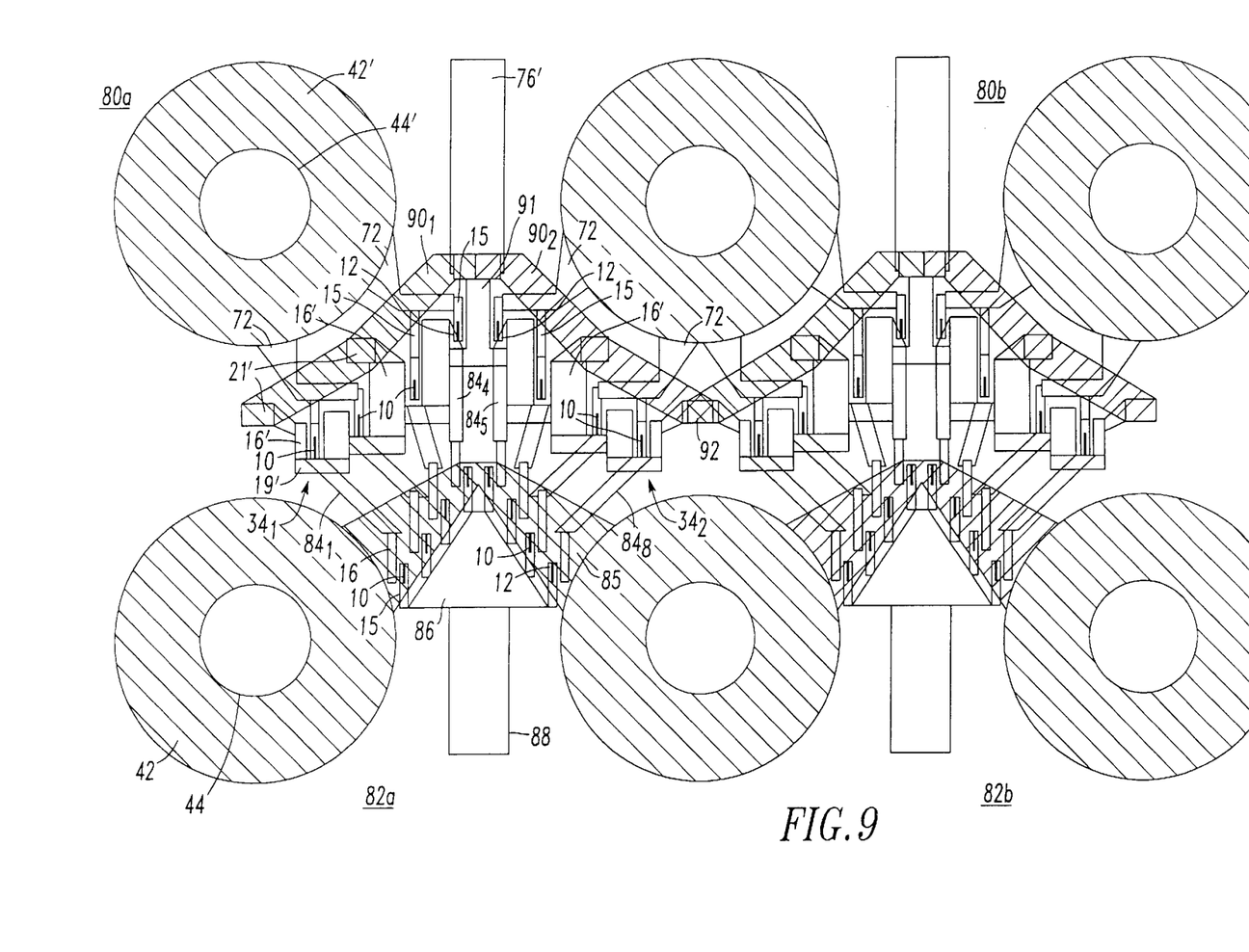
FIG. 9 is a layout of a cascode HBT circuit configuration in accordance with still another preferred embodiment of the subject invention.

Considering now the preferred embodiments of the invention which are shown in FIGS. 7, 8 and 9 and which employ the staggered sub-cell concept as illustrated in FIG. 6, FIG. 7 discloses a common-emitter HBT configuration comprised of two HBT cells $60_a$ and $60_b$, each consisting of eight sub-cells $34_1$ . . . $34_8$. The emitter fingers 10 of one set of sub-cells $34_1$ . . . $34_4$ are commonly connected to one of the three ground vias 44 by an outwardly extending generally rectangular patch of metallization $62_1$, while the emitter fingers 10 of a second set of sub-cells $34_5$ . . . $34_8$ are commonly connected to another of the three ground vias by a like area of metallization $62_2$. The base conductor elements 15 now commonly connect to a base terminal metallization pattern 64 which includes two intermediate outwardly extending angulated arms 65 and a pair of linear top cross members 66. The collector segments 16 are connected together by means of segments 19 and then to collector terminal 67 by outwardly extending underlying arm members $68_1$ and $68_2$ which also connect to the collector segments 16 by means of elements 21. What is significant about the configuration shown in FIG. 7 is that uniform signal distribution is achieved by base feed elements 64, 65 and 66.

Turning attention now to FIG. 8, shown thereat is an embodiment of a common base HBT configuration wherein the base conductor elements 15 at the end of the base fingers 12 (FIG. 2) are commonly connected to ground vias 44 by means of a pair of relatively short angulated metallization members $72_1$ and $72_2$ on both sides of HBT cells $70_a$ and $70_b$. The emitter fingers 10 are all commonly connected together by a pair of underlying metallization regions $73_1$, $73_2$ and a triangular section of metallization 74 to which is connected an outwardly extending terminal member 75. Further as shown in FIG. 8, the collector segments 16 are connected to a collector terminal 76 by outwardly extending collector segments 21 and underlying diverging arms of metallization $78_1$ and $78_2$. In the embodiment shown in FIG. 8, the two sections of metallization $73_1$ and $73_2$ directly connected to the emitter fingers 10 and the triangular shaped metallization 74 act as thermal shunts.

Considering now the third embodiment of the present invention, it comprises a cascode HBT configuration where two transistors are connected in series such that the emitter of one transistor is directly connected to the collector of the other transistor. Accordingly, in the configuration of FIG. 9, one cell $80_a$ of an upper pair of HBT cells $80_a$ and $80_b$ is series connected to one cell $82_a$ of a lower pair of HBT cells $82_a$ and $82_b$. Likewise, cell $80_b$ is series connected to cell $82_b$ with each cell consisting of eight sub-cells $34_1$ . . . $34_8$.

As shown, the respective emitter fingers 10 of the upper cells $80_a$ and $80_b$ are directly connected to the collector elements 16 of the lower pair of HBT cells $82_a$ and $82_b$ by means of individual connector strips of metallization as shown by reference numeral $84_1$, $84_2$ . . . $84_8$. A lower set of vias 44 provide a ground connection for the emitter fingers 10 of cells $82_a$ and $82_b$ which are connected thereto by means of inverted V-shaped areas of metallization 85 which terminate at the annular areas of metallization 42 surrounding the vias 44. The areas of metallizations 85 also act as thermal shunts. The base finger conductor elements 15 commonly connect to arrow shaped metallization 86 including base terminals 88 for the lower pair of cells $82_a$ and $82_b$.

With respect to the upper pair of HBT cells $80_a$ and $80_b$, all of the collector contact segments 16' which are similar to segments 16 shown in FIG. 8 are connected to an outwardly extending collector terminal strip member 21 by segments 19'. Their opposite ends are connected to two outwardly extending strips of metallization $90_1$ and $90_2$ by elements 21' and 91. With respect to the base conductor elements 15 of the upper pair of HBT cells $80_a$ and $80_b$, they are commonly connected to by-pass capacitors, not shown, connected to vias 44' and associated annular rings of metallization 42'. The base conductor elements 15, moreover, connect to the annular metallization areas 42' by means of pairs of angulated metallization segments 72.

With respect to the three embodiments shown in FIGS. 7, 8 and 9, the placement of the ground vias 44 and 44' results in a compactness that provides an improvement in power density. In comparison to the placement of the via connections 44 shown in the prior art configurations at FIGS. 3 and 5, the vias occupy significant space in the horizontal direction. However, with the staggered type of sub-cell arrangement in accordance with the subject invention of FIGS. 7, 8 and 9, the vias 44 and 44' are moved relatively closer together so as to reduce overall horizontal distance. This is best illustrated with the common emitter configuration shown in FIG. 7. There it will be noticed that the via hole connection 44 is essentially at an equal distance from each emitter finger 10. The base contacts 15, moreover, are also arranged to insure a substantially equidistance as maintained to the base feed line 64. This feature, together with the compactness of the cell, provides a uniform distribution without consuming additional horizontal distance. For the same junction temperature rise, the embodiments of the present invention can provide at least a 200% improvement in compactness compared to the "fish-bone" design shown, for example, in FIG. 3, and is at least 400% when compared to the in-line configuration shown in FIG. 5.

Thus what has been shown and described is a HBT design that provides very low mutual heating between individual emitter fingers and therefore lower junction temperature for high reliability operation. The subject invention also provides a substantial increase in physical compactness in the most critical dimension of the power amplified chip without increasing its thermal resistance. This improvement in compactness translates directly to increased output power for a given chip size. Also, the common problem of unequal signal distribution to each part of a high power HBT transistor is solved by the cell compactness and the symmetry of emitter finger layout.

Having thus shown and described what is at present considered to be the preferred embodiments of the invention, it should be known that the same has been made by way of illustration and not limitation. Accordingly, all modifications, alterations and changes coming within the spirit and scope of the invention are herein meant to be included.

What is claimed is:

1. A heterojunction bipolar transistor device, comprising:
   at least one heterojunction bipolar transistor cell including a plurality of sub-cells connected in parallel, located at a common active area on a semiconductor substrate, and arranged in two mutually adjacent sets of sub cells;
   wherein said sub-cells are mutually aligned in offset relationship so as to be staggered in a predetermined direction and defining a chevron type of cell configuration on the active area of the substrate, thereby providing increased power density while at the same time eliminating frequency dispersion and,
   wherein said sub-cells include side-by-side emitter, base and collector electrodes, said emitter electrode of each sub-cell including a relatively thin, elongated contact member, said base electrode including at least one relatively thin, elongated base contact member located adjacent said emitter electrode, and said collector electrode including at least one elongated collector contact member located adjacent said base electrode.

2. A heterojunction bipolar transistor device according to claim 1 wherein said emitter and base electrodes comprise finger electrodes.

3. A heterojunction bipolar transistor device according to claim 1 wherein said base electrode comprises a pair of elongated base contact members located adjacent each side of said emitter electrode and said collector electrode comprises a pair of elongated collector contact members located outwardly adjacent said pair of base contact members.

4. A heterojunction bipolar transistor according to claim 3 wherein said base electrode comprises a bifurcated contact member straddling the emitter electrode contact member.

5. A heterojunction bipolar transistor device according to claim 4 wherein at least one of said collector contact members comprises a common collector electrode for a pair of adjacent sub-cells and is coextensive with the base electrode of one of said sub-cells.

6. A heterojunction bipolar transistor device according to claim 9 wherein said bifurcated base contact member terminates in a common contact segment of a predetermined length rearwardly of said emitter electrode and wherein said pair of collector contact members are at least coextensive with said bifurcated base contact member and said common contact segment of the base electrode.

7. A heterojunction bipolar transistor device according to claim 6 wherein said base electrode further includes an elongated conductor element located at an end of the common contact segment and wherein at least one of said pair of collector contact members is coextensive with said base electrode including said elongated conductor element.

8. A heterojunction bipolar transistor device according to claim 1 wherein said emitter electrode, said base electrode, and said collector electrode are generally rectangular in shape.

9. A heterojunction bipolar transistor device according to claim 7 and additionally including first interconnect circuitry for commonly connecting the base electrodes to a base terminal, second interconnect circuitry for commonly connecting the collector electrodes to a collector terminal, and third interconnect circuitry for commonly connecting the emitter electrodes to a ground terminal, thereby forming a common emitter circuit configuration.

10. A heterojunction bipolar transistor device according to claim 9 wherein said first, second and third interconnect circuitry includes respective patterns of metallization formed on said substrate and said ground terminal includes a ground via in said substrate.

11. A heterojunction bipolar transistor device according to claim 7 and additionally including first interconnect circuitry for commonly connecting the emitter electrodes to an emitter terminal, second interconnect circuitry for commonly connecting the collector electrodes to a collector terminal, and third interconnect circuitry for commonly connecting the base electrodes to a ground terminal, thereby forming a common base circuit configuration.

12. A heterojunction bipolar transistor device according to claim 11 wherein said first, second and third interconnect circuitry includes respective patterns of metallization formed on said substrate and said ground terminal includes a ground via in said substrate.

13. A heterojunction bipolar transistor device according to claim 7 wherein said at least one heterojunction bipolar transistor cell comprises at least a pair of said cells arranged side by side in a direction transverse to the predetermined direction of offset of said sub-cells, and including a ground via located adjacent each set of sub-cells.

14. A heterojunction bipolar transistor device according to claim 7 wherein said at least one heterojunction bipolar transistor cell comprises a first and a second heterojunction bipolar transistor cell connected together in a cascode circuit configuration.

15. A heterojunction bipolar transistor device according to claim 14 wherein the emitter electrodes of the first transistor cell are directly connected to the collector electrodes of the second transistor cell, and wherein the first transistor cell further includes first interconnect circuitry for commonly connecting the collector electrodes thereof to a collector terminal and second interconnect circuitry for commonly connecting base electrodes thereof to by-pass capacitor circuit means, and wherein the second transistor cell further includes third interconnect circuitry for commonly connecting the emitter electrodes thereof to a ground terminal, and fourth interconnect circuitry for commonly connecting the base electrodes thereof to a base terminal.

16. A heterojunction bipolar transistor device according to claim 15 wherein the first, second, third and fourth interconnect circuitry comprises respective patterns of metallization formed on said semiconductor substrate and wherein said by-pass capacitor circuit means and said ground terminal include vias in said semiconductor substrate.

* * * * *